United States Patent [19]
Yamaguchi et al.

[11] Patent Number: 5,821,586
[45] Date of Patent: Oct. 13, 1998

[54] SEMICONDUCTOR DEVICE INCLUDING A PROTECTIVE ELEMENT HAVING NEGATIVE RESISTANCE CHARACTERISTIC

[75] Inventors: Kazumi Yamaguchi; Takao Arai, both of Tokyo, Japan

[73] Assignee: NEC Corporation, Tokyo, Japan

[21] Appl. No.: 543,047

[22] Filed: Oct. 13, 1995

[30] Foreign Application Priority Data

Oct. 14, 1994 [JP] Japan ................................ 6-276061

[51] Int. Cl.[6] .................................................. H01L 23/62
[52] U.S. Cl. ........................... 257/355; 257/173; 257/368
[58] Field of Search ..................... 257/173, 355, 257/368, 551, 603

[56] References Cited

U.S. PATENT DOCUMENTS 5,486,709  1/1996  Hayashi et al. ........................ 257/110

*Primary Examiner*—Mark V. Prenty
*Attorney, Agent, or Firm*—Whitham, Curtis, Whitham & McGinn

[57] ABSTRACT

A semiconductor device has a vertical MOS FET and a trigger element connected between the drain and the gate of the MOS FET. The trigger element has a heavily doped n region, a lightly doped p region and a lightly doped n region. The trigger element has a breakdown voltage lower than the drain-to-source rated voltage of the MOS FET and exhibits a negative resistance characteristic. A surge voltage entering the drain of the MOS FET raises the gate potential of the MOS FET by flowing through the trigger element to thereby trigger the source-drain path of the MOS FET. The negative resistance characteristic of the trigger element enables to lower the temperature rise of the MOS FET to thereby protect the MOS FET against thermal destruction. A bidirectional diode set may be connected in series to the trigger element to design various breakdown voltage of the protective path.

9 Claims, 3 Drawing Sheets

SEMICONDUCTOR DEVICE INCLUDING A PROTECTIVE ELEMENT HAVING NEGATIVE RESISTANCE CHARACTERISTIC

BACKGROUND OF THE INVENTION (a) Field of the Invention

The present invention relates to a semiconductor device including a protective element having both a breakdown function and a negative resistance characteristic and, more particularly, to a semiconductor device having a protective element for protecting a transistor against an overvoltage breakdown.

(b) Description of Related Art

FIG. 1 shows a circuit diagram of an n-cannel vertical MOS FET 20 having a bidirectional Zener diode set connected between the drain electrode and gate electrode of the MOS FET, in which at least one first Zener diode 21 is connected in series with a second Zener diode 22. The first Zener diode 21 is reverse biased by a positive surge voltage enterring the drain electrode of the MOS FET whereas the second diode 22 is forward biased by the surge voltage. A gate resistor RG is connected between the gate terminal G and the gate electrode of the MOS FET 20.

FIG. 2 shows the structure of a semiconductor device implementing the MOS FET and bidirectional Zener diode set of FIG. 1. The semiconductor device includes an n+ substrate 2 having a drain electrode 12 of the vertical MOS FET at the back surface thereof. An n− epitaxial layer 1 serving as a drift layer for the MOS FET is formed on the main surface of the n+ substrate 2. A plurality of first Zener diodes Z1 ($Z1_1, \ldots, Z1n$) and a second Zener diode Z2 are formed in the vicinity of the upper surface of the n− epitaxial layer 1, each of the Zener diode $Z1_1, \ldots, Z1n$ and Z2 having a p+ anode region 3 formed within the n− epitaxial layer 1 and an n+ cathode region 4 formed within the p+ anode region 3. In general, the p+ anode regions 3 are formed simultaneously with the formation of a P well of the MOS FET while the n+ cathode regions 4 are formed simultaneously with the formation of the n+ source region of the MOS EFT.

The n+ cathode region 4 of the second Zener diode Z2 contacts interconnection 61 penetrating an interlayer insulating film 52 covering a field oxide film 51, whereby the n+ cathode region 4 of the second Zener diode Z2 is connected to the unillustrated gate electrode of the MOS FET through the interconnection 61. The p+ anode region 3 of the second Zener diode Z2 is connected to the p+ anode region 3 of the first one of the first Zener diode $Z1_1$ through inteconnection 62.

Adjacent two of the plurality of first Zener diodes $Z1_1, \ldots, Z1n$ are connected such that the n+ cathode region 4 of one of the two first Zener diodes is connected to the p+ anode region 3 of the other through interconnection 63. The n+ cathode region 4 of Zener diode Z1n of the first Zener diodes is connected to an n+ contact region 41 through interconnection 64, and the n+ contact region 41 is connected to the drain electrode 12 of the MOS FET via the n− drift layer 1 and the n+ substrate 2. The above structure is described in Patent Publication No. JP-A-4-65878, for example.

Turning back to FIG. 1, the sum (V21) of the Zener voltages of the first Zener diodes 21 is designed to be slightly lower than the rated voltage of the MOS FET 20. Accordingly, when the potential at the drain terminal D for the MOS FET exceeds a predetermined value due to a surge voltage to provide a voltage drop across the first Zener diodes 21 exceeding the breakdown voltage V21 of the first Zener diodes 21, the first Zener diodes 21 become conductive so that current flows from the drain terminal D to the gate terminal G via the bidirectional Zener diode set and the gate resistor RG. As a result, the MOS FET 20 is turned on due to the high gate voltage so that the energy of the surge voltage is absorbed by the source-drain path of the MOS FET 20, thereby preventing the overvoltage destruction of the MOS FET.

In the conventional semiconductor device, however, MOS FETs often suffer from an excessive temperature rise due to the large current flowing therethrough, thereby being thermally broken or destroyed.

SUMMARY OF THE INVENTION

In view of the foregoing problem involved in conventional semiconductor devices, it is an object of the present invention to provide an improved semiconductor device which can protect a transistor element even when an excessive high surge voltage is applied thereto.

The present invention provides a semiconductor device having a transistor element having a first electrode, second electrode, a current path formed between the first electrode and second electrode and a control electrode for controlling current in the current path, the transistor having a rated voltage between the first electrode and second electrode; and a protective path including a trigger element and connected between the first electrode and control electrode. The trigger element has a breakdown voltage lower than the rated voltage of the transistor element and exhibits a negative resistance characteristic during the conductive state thereof.

The present invention also provides a semiconductor device, wherein the protective path includes a trigger element and a bidirectional diode set connected in series between the gate electrode and the drain region of the MOS FET.

In the semiconductor device according to the present invention, when a surge voltage is applied to the first electrode of the transistor element, the energy of the surge voltage can be effectively absorbed by breakdown of the current path of the transistor triggered by the trigger element in the protective path while preventing the transistor from excessive heating.

Also, when a bidirectional Zener diode set is used together with the trigger element in the protective path, it becomes possible to design a desired breakdown voltage for various kinds of MOS FETs with ease. The bidirectional Zener diode set is preferably formed in a polycrystalline silicon layer formed on an insulator layer because Zener diodes formed in the polycrystalline silicon layer generally have accurate breakdown voltage at the junction thereof.

BRIEF DESCRIPTION OF THE DRAWINGS

The above and other objects, features and advantages of the present invention will be more apparent from the following description, referring to the accompanying drawings in which.

DESCRIPTION OF THE PREFERRED EMBODIMENTS

Embodiments of the present invention will now be described with reference to the accompanying drawings.

Figure 3:
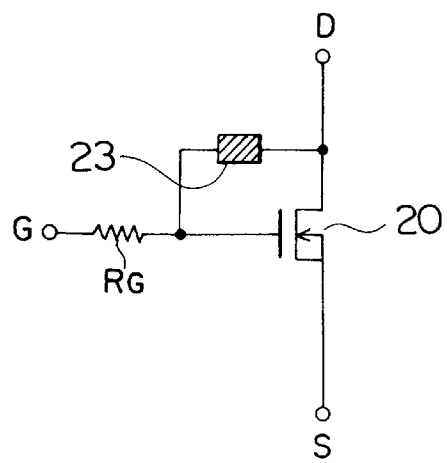
FIG. 3 is an equivalent circuit diagram of a MOS FET in a semiconductor device according to a first embodiment of the present invention.
Figure 4:
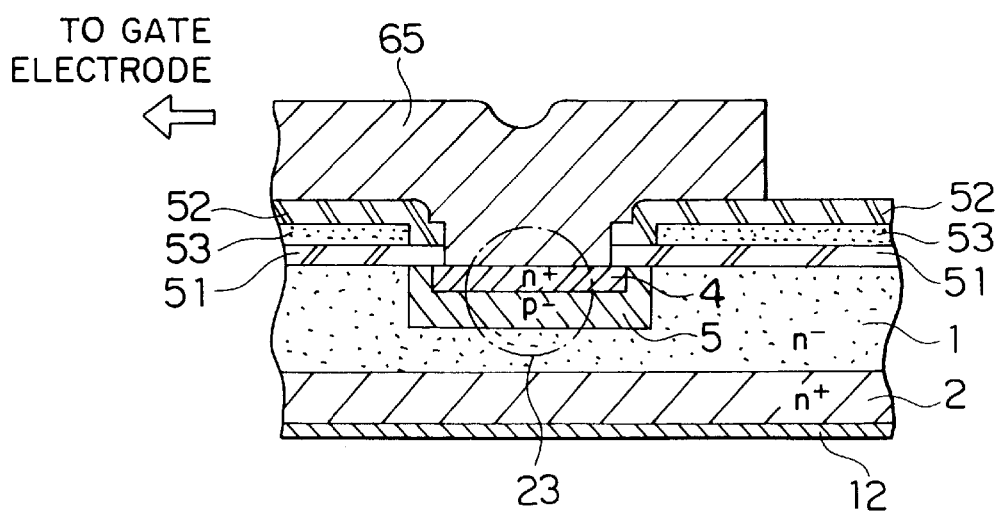
FIG. 4 is a sectional view of the MOS FET of FIG. 3.

Referring to FIG. 3, there is shown a vertical MOS FET 20 and a trigger element 23 in a semiconductor device according to a first embodiment of the present invention. The structure of the semiconductor device of FIG. 3 is shown in FIG. 4.

Figure 5:
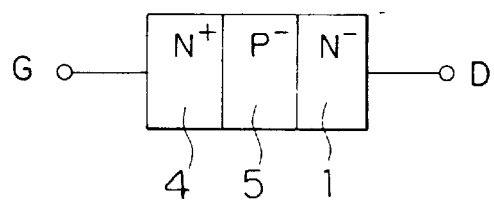
FIG. 5 is a schematic illustration showing a trigger element as used in the embodiment of FIGS. 3 and 4.

In this text, the term "trigger element" is meant by an element having a breakdown function responding to an excessive voltage applied between the first electrode and the second electrode and exhibiting a negative resistance characteristic during conductive state thereof, such as shown in FIG. 5. The trigger element shown in FIG. 5 has an n+ region 4, a p+ region 5, and an n− region 1 consecutively arranged and forming respective Junctions between two of them. The p–n junctions may be formed parallel to the substrate or perpendicular to the substrate. The trigger element has a configuration similar to that of a bidirectional diode set including two serial diodes connected back-to-back with a common anode implemented by the p− region 5. The trigger element, however, has a configuration in which the heavily doped n+ region 4 and the lightly doped n− region 1 sandwich the lightly doped p− region 5 therebetween.

The impurity concentrations of n+ region 4, p− region 5 and n− region 1 are, for example, between $1 \times 10^{19}$ and $1 \times 10^{21}$ atoms/cm$^3$, between $1 \times 10^{16}$ and $1 \times 10^{18}$ atoms/cm$^3$ and between $1 \times 10^{16}$ and $1 \times 10^{18}$ atoms/cm$^3$, respectively. The n+ region and p− or n− region have resistivities of, for example, 0.04 Ω·cm and 0.6 Ω·cm, respectively. Namely, the latter has a resistivity approximately one order higher than that of the former.

When a positive voltage exceeding the breakdown voltage $V_{BO}$ of the reversed biased junction of the trigger element is applied to the n− region 1, the trigger element discharges the charge accumulated at the electrode of the n− region 1, then begins to accumulate charges at the end of the discharge period. This operation is periodically repeated to establish an oscillation which will fade gradually and eventually to release the energy of the surge voltage.

The semiconductor device of the first embodiment is manufactured as follows. First, in FIG. 4, a drain electrode 12 for the MOS FET is formed on a back surface of an n+ substrate 2, following which an n− epitaxial layer 1 having a resistivity of 0.7 Ω·cm is formed on the main surface of the n+ substrate 2. An oxide film 51 having a thickness of 6000 angstroms (A) is formed over the n− epitaxial layer 1. The oxide film 51 is then patterned by using a photolithographic technique.

A polycrystalline silicon film 53 having a thickness of 6000 A is further formed on the silicon oxide film 51, then patterned by a photolithographic technique. Subsequently, an n+ region 4 having a resistivity between 0.04 and 0.06 Ω·cm and a p− region 5 having a resistivity of 0.6 Ω·cm are formed within the epitaxial layer 1 by an ion implantation technique in the vicinity of the surface of the n− epitaxial layer 1. Above them, an interlayer PSG film 52 is formed in a thickness of 5000 A, then subjected to patterning by using a photolithographic technique. The n+ region 4 is formed within the p− region 5 to thereby form therebetween a first junction of the trigger element 23, which has a second junction between the p− region 5 and the n− epitaxial layer 1. The n+ region 4 is in ohmic-contact with an aluminum electrode 65 and connected thereby to the unillustrated gate electrode of the MOS FET.

In FIG. 3, the breakdown voltage V23 of the trigger element 23 is designed to be slightly lower than the drain-to-source rated voltage of the MOS FET 20. When the potential at the drain terminal D for the MOS FET exceeds a predetermined value, which is below the rated voltage of the MOS FET 20, to provide a voltage drop across the trigger element 23 exceeding the breakdown voltage V23 thereof, the trigger element 23 is "broken-down" to become conductive. Accordingly, current flows from the drain terminal D to a gate terminal G via the trigger element 23 and a gate resistor RG, so that the gate voltage of the MOS FET 20 becomes high to turn on the MOS FET 20.

In this case, however, if the surge voltage enterring the drain terminal D is excessively high, the clamped voltage of the gate electrode is lower than that of the conventional device due to a relatively high resistance of the trigger element 23 exhibiting a negative resistance characteristic during the conductive state thereof. Accordingly, the energy rate of the surge voltage at which the surge voltage is absorbed by the MOS FET 20 is low so that the over-heating and thermal destruction of the MOS FET 20 can be securely prevented.

Figure 1:
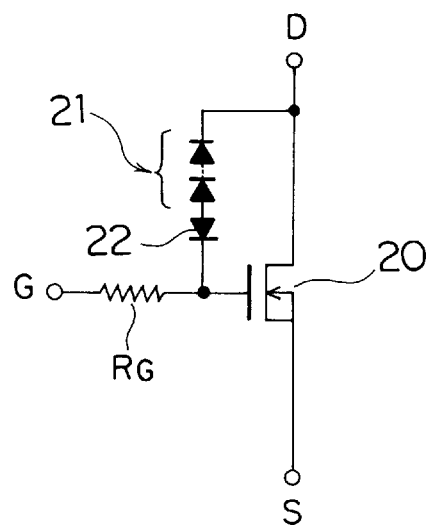
FIG. 1 is an equivalent circuit diagram of a MOS FET in a conventional semiconductor device.
Figure 2:
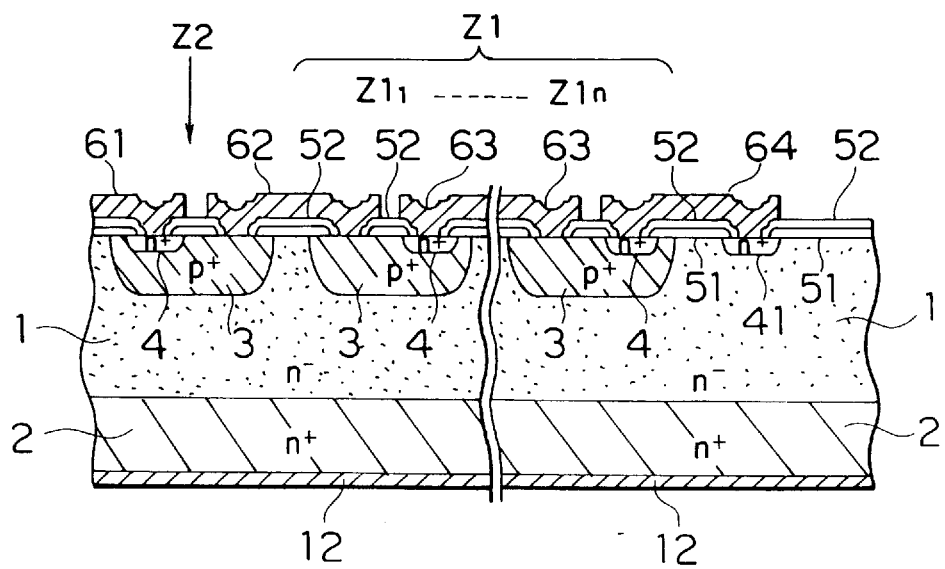
FIG. 2 is a sectional view of the MOS FET of FIG. 1.

In the conventional semiconductor device of FIG. 1, whole energy generated due to an excessive surge voltage is absorbed substantially instantaneously by the MOS FET 20. As a result, the MOS FET 20 often suffers from an excessive temperature rise due to the large current flowing therethrough, as described before, thereby being thermally destroyed. The present invention solves the problem.

Figure 6:
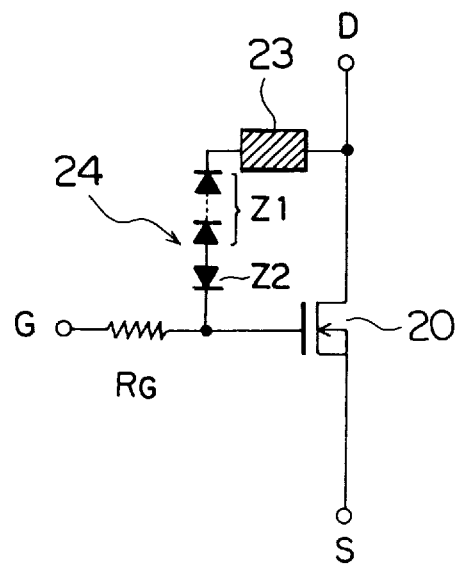
FIG. 6 is an equivalent circuit diagram of a MOS FET in a semiconductor device according to a second embodiment of the present invention.
Figure 7:
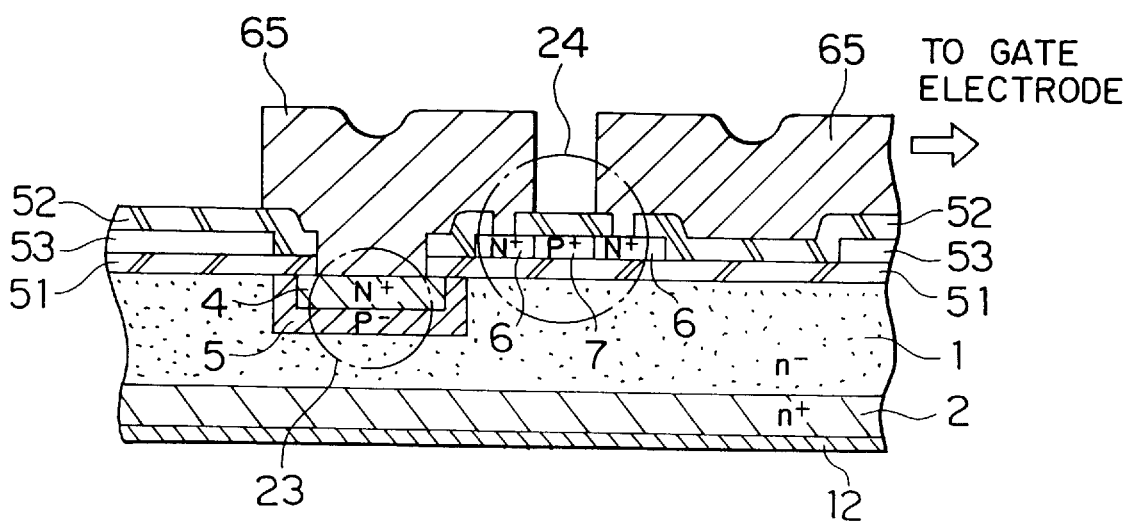
FIG. 7 is a sectional view of the MOS FET of FIG. 6.

FIGS. 6 and 7 show a semiconductor device according to a second embodiment of the present invention, similarly to FIGS. 3 and 4.

In the present embodiment, a protective path including a trigger element and a bidirectional Zener diode set 24 connected in series is provided between the drain electrode and the gate electrode of a Mos FET, instead of the single use of a trigger element in the first embodiment.

In detail, in addition to the trigger element 23 in the first embodiment, a set of a first n+ region 6, a p+ region 7 and a second n+ region 6 are formed within the polycrystalline silicon layer 53 and consecutively arranged in the direction parallel to the main surface of the substrate 2, to thereby implement a bidirectional Zener diode 24 having p–n junctions perpendicular to the main surface of the substrate 2. The second n+ region is connected to the unillustrated gate electrode of the MOS FET through interconnection 65. The number of the forward and reverse biased p–n junctions included in the bidirectional Zener diode set 24 can be designed in accordance with the rated voltage of the MOS FET.

In the way as described above, the bidirectional Zener diode 24 is disposed in the polycrystalline silicon layer 53, which is isolated from the semiconductor substrate 2 by an insulating film 51. The bidirectional diode set 24 formed within the polycrystalline silicon layer has an accurate breakdown voltage. The remaining portions of the second embodiment are similar to those in the first embodiment.

The sum of the breakdown voltage V23 of the trigger element 23 and the breakdown voltage V24 of the bidirectional Zener diode 24 is designed to be slightly lower than the drain-to-source rated voltage of the MOS FET 20.

In operation of the second embodiment, over-heating and resultant thermal destruction of the MOS FET 20 can be securely prevented, similarly to the first embodiment. Moreover, the bidirectional Zener diode set 24 can be designed to have a desired breakdown voltage by selecting the number of the reverse biased. Zener diodes. Accordingly, it is possible to apply the present invention to various rated voltages of MOS FETs.

For example, when the drain-to-source rated voltage of the MOS FET 20 is 60 V and the breakdown voltage of the trigger element 23 is 10 V, five reverse biased Zener diodes 24 each having a breakdown voltage of 8 V are used in series. In this case, the total breakdown voltage of the trigger element 23 and the bidirectional Zener diodes 24 is designed 50 V (10 V+8 V×5). Accordingly, even when a surge voltage is applied between the drain electrode and source electrode of the MOS FET 20, the trigger element 23 and the bidirectional Zener diodes 24 become conductive before the surge voltage reaches the rated voltage (60 V) of the MOS FET 20, which is higher than the breakdown voltage of the drain-to-gate path by 10 V.

Since the above embodiments are described only for examples, the present invention is not limited to such embodiments and it will be obvious for those skilled in the art that various modifications or alterations can be easily made based on the above embodiments within the scope of the present invention.

For example, the trigger element is not limited to the one shown in FIG. 5. Similarly, the transistor element is not limited to the vertical NMOS FET, but extended to any type of transistor including a horizontal NMOS or PMOS FET and a bipolar transistor.

What is claimed is:

1. A semiconductor device comprising: an insulated gate transistor having a first electrode, a second electrode, a current path formed between said first electrode and said second electrode, and a control electrode for controlling current in said current path, said insulated gate transistor having a rated voltage between said first electrode and second electrode; and a trigger element connected between said first electrode and said control electrode, said trigger element having a breakdown voltage lower than the rated voltage of said insulated gate transistor and exhibiting a negative resistance characteristic.

2. A semiconductor device as defined in claim 1 wherein said trigger element has a first region of a first conductivity type having a first impurity concentration, a second region of a second conductivity type having a second impurity concentration lower than said first impurity concentration, and a third region of the first conductivity type having an impurity concentration substantially equal to said second impurity concentration, said first region and said third region sandwiching said second region.

3. A semiconductor device as defined in claim 2 wherein said first impurity concentration and said second impurity concentration range between $1\times10^{18}$ and $1\times10^{21}$ atoms/cm$^3$ and between $1\times10^{16}$ and $10^{18}$ atoms/cm$^3$, respectively.

4. A semiconductor device as defined in claim 3 wherein said insulated gate transistor is an n-type FET and said first conductivity type is n-type and said second conductivity type is p-type.

5. A semiconductor device comprising: an insulated gate transistor having a first electrode, a second electrode, a current path formed between said first electrode and said second electrode and a control electrode for controlling current in said current path, said insulated gate transistor having a rated voltage between said first electrode and said second electrode; and a protective path including a trigger element having a breakdown function and a negative resistance characteristic and a bidirectional diode set connected in series to said trigger element, said protective path being connected between said first electrode and said control electrode and having a breakdown voltage lower than the rated voltage of said insulated gate transistor.

6. A semiconductor device as defined in claim 5 wherein said trigger element has a first region of a first conductivity type having a first impurity concentration, a second region of a second conductivity type having a second impurity concentration lower than said first impurity concentration, and a third region of the first conductivity type having an impurity concentration substantially equal to said second impurity concentration, said first region and said third region sandwiching said second region.

7. A semiconductor device as defined in claim 6 wherein said first impurity concentration and said second impurity concentration range between $1\times10^{18}$ and $1\times10^{21}$ atoms/cm$^3$ and between $1\times10^{16}$ and $10^{18}$ atoms/cm$^3$, respectively.

8. A semiconductor device as defined in claim 7 wherein said insulated gate transistor is an n-type FET and said first conductivity type is n-type and said second conductivity type is p-type.

9. A semiconductor device as defined in claim 5 wherein said bidirectional diode set includes a plurality of first diodes and a second diode, said plurality of first diodes and second diode being connected back-to-back with a common anode disposed therebetween.

\* \* \* \* \*